US012684941B2

(12) United States Patent
Lee

(10) Patent No.: US 12,684,941 B2
(45) Date of Patent: Jul. 14, 2026

(54) LIGHT EXTRACTION SUBSTRATE AND ORGANIC LIGHT-EMITTING DEVICE INCLUDING SAME

(71) Applicant: Corning Incorporated, Corning, NY (US)

(72) Inventor: JooYoung Lee, Anyang-si (KR)

(73) Assignee: CORNING INCORPORATED, Corning, NY (US)

( * ) Notice: Subject to any disclaimer, the term of this patent is extended or adjusted under 35 U.S.C. 154(b) by 357 days.

(21) Appl. No.: 18/265,382

(22) PCT Filed: Nov. 30, 2021

(86) PCT No.: PCT/US2021/061140
§ 371 (c)(1),
(2) Date: Jun. 5, 2023

(87) PCT Pub. No.: WO2022/119813
PCT Pub. Date: Jun. 9, 2022

(65) Prior Publication Data
US 2024/0114717 A1    Apr. 4, 2024

(30) Foreign Application Priority Data

Dec. 4, 2020    (KR) ........................ 10-2020-0168990

(51) Int. Cl.
*H10K 50/854*        (2023.01)
(52) U.S. Cl.
CPC ................................... *H10K 50/854* (2023.02)
(58) Field of Classification Search
CPC ..................................................... H10K 50/854

USPC ......................................................... 313/509
See application file for complete search history.

(56) References Cited

U.S. PATENT DOCUMENTS

| | | | |
|---|---|---|---|
| 2004/0061107 A1* | 4/2004 | Duggal | ................. H10K 59/35 257/40 |
| 2016/0020429 A1 | 1/2016 | Kuroki | |
| 2016/0093779 A1 | 3/2016 | Maeno et al. | |
| 2017/0005295 A1 | 1/2017 | Takeda et al. | |
| 2020/0103583 A1 | 4/2020 | Kim et al. | |

(Continued)

FOREIGN PATENT DOCUMENTS

WO        2019/222240 A1    11/2019

OTHER PUBLICATIONS

International Search Report and Written Opinion of the International Searching Authority; PCT/US2021/061140; dated Feb. 14, 2022; pp. 13; International Searching Authority.

(Continued)

*Primary Examiner* — Christopher M Raabe
(74) *Attorney, Agent, or Firm* — Yiqun Zhao

(57)        ABSTRACT

Provided is a light extraction substrate disposed on a front portion of an organic light-emitting diode (OLED) to extract light from the OLED. The light extraction substrate includes abase substrate and a light extraction layer disposed on the base substrate. The light extraction layer includes a matrix layer and $BaTiO_3$ light-scattering particles dispersed in the matrix layer. The matrix layer contains a siloxane-based organic-inorganic hybrid material. An organic light-emitting device includes the light extraction substrate and an OLED disposed on the light extraction layer of the light extraction substrate.

10 Claims, 1 Drawing Sheet

(56)     References Cited

U.S. PATENT DOCUMENTS

| | | | |
|---|---|---|---|
| 2020/0201124 A1* | 6/2020 | Lee | C08K 5/372 |
| 2021/0111072 A1* | 4/2021 | Tsuji | H01L 25/18 |
| 2021/0115331 A1* | 4/2021 | Won | C09K 11/883 |
| 2022/0162418 A1* | 5/2022 | Hosoi | C08L 63/00 |
| 2023/0107922 A1* | 4/2023 | Yoneda | B32B 15/043 |
| | | | 428/473.5 |
| 2023/0257571 A1* | 8/2023 | Tokuda | C08F 2/44 |

OTHER PUBLICATIONS

Korean Patent Application No. 10-2020-0168990 , Office Action dated Jan. 24, 2025, 3 pages (English Translation only), Korean Patent Office.

* cited by examiner

| |
|---|
| 500 |
| 400 |
| 300 |
| 200 |
| 100 |

LIGHT EXTRACTION SUBSTRATE AND ORGANIC LIGHT-EMITTING DEVICE INCLUDING SAME

CROSS-REFERENCE TO RELATED APPLICATIONS

This application claims the benefit of priority under 35 U.S.C. § 371 of International Application No. PCT/US2021/061140, filed on Nov. 30, 2021, which claims the benefit of priority under 35 U.S.C. § 119 of Korean Patent Application Serial No. 10-2020-0168990 filed on Dec. 4, 2020, the content of which are relied upon and incorporated herein by reference in their entirety.

BACKGROUND

Field

The present disclosure relates to a light extraction substrate and an organic light-emitting device including the same, the light extraction substrate provided for extracting a greater amount of light from the organic light-emitting device.

Description of Related Art

With increasing interest in the light extraction efficiency of organic light-emitting diodes (OLEDs), studies focused on an internal or external light extraction layer have been actively undertaken.

Due to the structural limitation of OLEDs, about 20% of light generated thereby may reach the outside thereof. In order to overcome this inefficiency, studies focused on the light extraction layer for extracting 80% of light that would otherwise be lost in optical waveguide mode are underway.

The light extraction layer is generally divided into an internal light extraction layer and an external light extraction layer. The external light extraction layer is provided by disposing a film including a variety of structures on the outer surface of a substrate. The external light extraction layer may conveniently obtain a light extraction effect which does not significantly depend on the shape of the structures. However, the light extraction effect thereof is limited. The internal light extraction layer extracts light that would otherwise be lost in the optical waveguide mode. Thus, the internal light extraction layer advantageously has a much higher possibility for improvements in efficiency than the external light extraction layer.

The internal light extraction layer formed to maximize the light extraction efficiency of the OLED may be located between the substrate and a transparent electrode layer of the OLED. The internal light extraction layer may be provided in a variety of forms.

First, an internal light extraction layer in which materials having different refractive indices are mixed may be used. This layer may improve a light-scattering effect, thereby improving light extraction efficiency. In this regard, light-scattering matter having sizes utilizable by light waves must be mixed into the internal light extraction layer. Particles, voids, and the like may be used as light-scattering matter, and a variety of shapes and materials may be used to form the light-scattering matter. Another internal light extraction layer to change optical paths of light that would be lost in the optical waveguide mode in the transparent electrode layer using a high refractive index material may be used. Another internal light extraction layer to not only reduce the optical waveguide effect but also the surface plasmon effect using corrugations, may be used.

However, even in the case that such an internal light extraction layer is used, it may be difficult to obtain expected light efficiency in a related-art organic light-emitting device.

SUMMARY

Various aspects of the present disclosure provide a light extraction substrate able to effectively extract light that would otherwise be lost.

According to an aspect, provided is a light extraction substrate disposed on a front portion of an organic light-emitting diode (OLED) to extract light from the OLED. The light extraction substrate may include a base substrate; and a light extraction layer disposed on the base substrate. The light extraction layer may include a matrix layer and $BaTiO_3$ light-scattering particles dispersed in the matrix layer.

In some embodiments, the matrix layer may contain a siloxane-based organic-inorganic hybrid material.

In some embodiments, the $BaTiO_3$ light-scattering particles may have a light absorption rate of 10% or lower for light with a wavelength ranging from 380 nm to 420 nm, light with a wavelength ranging from 420 nm to 450 nm, and light with a wavelength ranging from 450 nm to 490 nm, respectively.

In some embodiments, the $BaTiO_3$ light-scattering particles may have a light absorption rate of 7% or lower for light with wavelength ranging from 380 nm to 420 nm, light with wavelength ranging from 420 nm to 450 nm, and light with wavelength ranging from 450 nm to 490 nm, respectively.

The $BaTiO_3$ light-scattering particles may have an average particle size ranging from 90 nm to 1 µm.

In some embodiments, the thickness of the matrix layer may be at least two times the average particle size of the $BaTiO_3$ light-scattering particles.

In some embodiments, the matrix layer may have a light absorption rate of 1% or lower for light with a wavelength ranging from 380 nm to 420 nm, light with a wavelength ranging from 420 nm to 450 nm, and light with a wavelength ranging from 450 nm to 490 nm, respectively.

In some embodiments, the light extraction layer may have a light absorption rate of 40% or lower for light with a wavelength ranging from 380 nm to 420 nm, 15% or lower for light with a wavelength ranging from 420 nm to 450 nm, and 10% or lower for light with a wavelength ranging from 450 nm to 490 nm.

In some embodiments, the light extraction layer may have a light absorption rate of 30% or lower for light with a wavelength ranging from 380 nm to 420 nm, 10% or lower for light with a wavelength ranging from 420 nm to 450 nm, and 10% or lower for light with a wavelength ranging from 450 nm to 490 nm.

In some embodiments, the light extraction layer may have a haze of 60% or higher.

According to another aspect, provided is an organic light-emitting device including: the light extraction substrate as described above; and an organic light-emitting diode (OLED) disposed on the light extraction layer of the light extraction substrate.

As set forth above, the present disclosure may provide a light extraction substrate able to effectively extract light that would otherwise be lost.

The methods and apparatuses of the present disclosure have other features and advantages that will be apparent from or that are set forth in greater detail in the accompanying drawings, the disclosures of which are incorporated herein, and in the following Detailed Description, when taken together, serve to explain certain principles of the present disclosure.

DETAILED DESCRIPTION

Figures 1, 2:
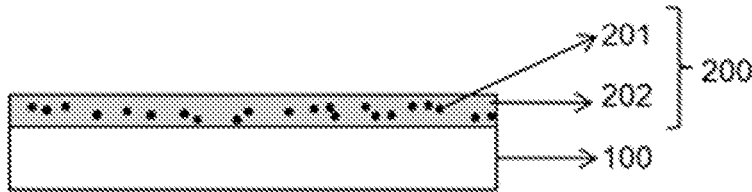
FIG. 1 is a view illustrating an organic light-emitting device according to an embodiment.
FIG. 2 is a view illustrating the light extraction substrate according to the embodiment.

Hereinafter, embodiments of the present disclosure will be described in detail with reference to the accompanying drawings.

FIG. 1 is a view illustrating an organic light-emitting device according to an embodiment.

As illustrated in FIG. 1, the organic light-emitting device may include a light extraction substrate and an organic light-emitting diode (OLED). The light extraction substrate may include a base substrate 100 and a light extraction layer 200 provided on the base substrate 100. The OLED may be provided on the light extraction layer 200. The OLED may include an anode layer 300 provided on the light extraction layer 200, an organic layer 400 provided on the anode layer 300, and a cathode layer 500 provided on the organic layer 400. The organic layer 400 may include a light-emitting layer. In some embodiments, the anode layer 300 may be transparent. In some embodiments, the anode layer 300 may contain a transparent conductive oxide, such as indium tin oxide (ITO). In some embodiments, the cathode layer 500 may contain a metal, such as aluminum (Al) or silver (Ag). When a current is applied through the two electrode layers (i.e. the anode layer 300 and the cathode layer 500), electrons and positive holes are combined in the light-emitting layer of the organic layer 400, thereby generating light. Light emitted from the organic layer exits the OLED through the light extraction layer. While an organic light-emitting device based on this mechanism is known as a bottom-emitting organic light-emitting device, the present disclosure is not necessarily limited to being a bottom-emitting organic light-emitting device.

FIG. 2 is a view illustrating the light extraction substrate according to the embodiment.

As described above, in some embodiments, the light extraction substrate may include the base substrate 100 and the light extraction layer 200. The base substrate 100 may be a glass substrate or a polymer substrate (formed from polyimide (PI), polymethyl methacrylate (PMMA), polyethylene terephthalate (PET), or the like). In some embodiments, the light extraction layer 200 may include a matrix layer formed on the base substrate 100 and light-scattering particles 201 dispersed in the matrix layer 202.

When the light-scattering particles 201 is used to improve light extraction efficiency, photons incident to the light extraction layer 200 from the OLED travel within the light extraction layer 200 in a reciprocating manner multiple times while changing light paths multiple times due to the light-scattering particles 201. During this process, photons may be frequently absorbed to the light extraction layer 200. Thus, the lower the absorption rates of the light-scattering particles 201 and the matrix layer 202 of the light extraction layer 200, the more effectively the efficiency of the organic light-emitting device may be improved.

In some embodiments, the light extraction layer 200 formed from a material having a low absorption rate for a short-wavelength range may be inserted below a transparent electrode layer so that a white organic light-emitting device may be easily realized, thereby maximizing the efficiency of the OLED lost by an optical waveguide or the like.

For the most efficient light extraction layer 200 to achieve the above-described objective, the following conditions, for example, are required:

Low absorption rate for the entire visible light wavelength range (380 nm to 780 nm). In particular, a low absorption rate for the short-wavelength range (380 nm to 490 nm) is required.

The light-scattering particles 201 and the matrix layer 202 must have low light absorption rates, respectively. When both the light-scattering particles 201 and the matrix layer 202 are used, the light absorption rates thereof must be minimum values.

Outgassing during or after a coating process for fabricating the light extraction layer 200 must not affect the OLED.

When the top surface of the light extraction layer 200 is coated with the transparent electrode layer, the surface roughness thereof must not affect the OLED.

The light-scattering particles 201 meeting the above-mentioned requirements may be $BaTiO_3$ particles. $BaTiO_3$ may be more advantageously used for the light-scattering particles 201 than $TiO_2$, due to the lower absorption rate thereof for short-wavelength light. When the sizes of the light-scattering particles 201 are smaller than $\frac{1}{4}$ of the wavelength of extraction light, the extraction light tends to move through the light-scattering particles 201 having such sizes without being influenced by the light-scattering particles 201. Thus, the average particle size of the light-scattering particles 201 may be preferably equal to or greater than 90 nm. Here, since the particle sizes are typically measured by laser diffraction, the average particle size may be an average diameter of the particles when the particles are spherical or an average length of a length along a longer axis and a length along a shorter axis of the particles when the particles are not spherical. In contrast, when the particles having greater sizes are used, the matrix layer 202 is required to be thick enough to planarize the surface thereof so that the transparent electrode layer may be stacked thereon without causing problems. In this case, efficiency may be significantly lowered due to high absorption rate and moisture content. Thus, the average particle size may preferably be determined to not exceed 1 μm.

A significant amount of light is lost from the OLED. In order to improve the light extraction efficiency, the $BaTiO_3$ particles serve to extract light and have such a low absorption rate as to minimize the amount of light lost during scattering therewithin while serving to extract the light. In addition, a siloxane-based organic-inorganic hybrid material having a low absorption rate may be used for the matrix layer 202 (i.e., a planarization layer) containing $BaTiO_3$ and coating the base substrate 100, so that the matrix layer 202 can extract light refracted by the light-scattering particles 201 without absorbing the light and provide the planarized surface for the transparent anode layer 300. Here, it is preferable that both the $BaTiO_3$ light-scattering particles 201 and the matrix layer 202 (i.e., the planarization layer) have a low absorption rate. In particular, it is preferable that the absorption rate for a low-wavelength range (380 nm to 490 nm) is as low as possible. For example, this feature may reduce electrical load in the driving of a 2-stack white OLED (e.g. a 2-stack white OLED generating blue light and yellow light) and maintain a color closer to white by improving the luminous efficiency of blue wavelengths. Such a combination of the light-scattering particles 201 and the matrix layer 202 may improve the light extraction efficiency, thereby increasing the longevity of the OLED.

The present disclosure is intended to fabricate a functional layer having a low absorption rate for short-wavelength light using the specific light-scattering particles and the matrix. When the arithmetic mean of absorption rates for individual colors of short-wavelength light is low, the light extraction efficiency may be maximized.

When the functional layer (i.e. the light extraction layer 200) as illustrated in FIG. 2 is typically added between the transparent electrode layer and the transparent substrate in the organic light-emitting device as illustrated in FIG. 1, the efficiency of the device may be improved. However, it may be easily observed that the efficiency is not improved as much as expected. This is because light generated by the OLED is lost since light scattered in the light extraction layer 200 serving as the functional layer is absorbed to the functional layer. In order to overcome this problem, the present disclosure proposes an absorption rate to meet the following conditions.

The absorption rate of the light-scattering particles may be 10% or less, more particularly, 7% or less, for the 380 nm to 420 nm range, the 420 nm to 450 nm range, and the 450 nm to 490 nm range. Here, the absorption rate of the light-scattering particles can be obtained by coating the substrate with the light-scattering particles; measuring the transmittance and reflectivity using a spectrophotometer; calculating a light absorption rate of the substrate and the light-scattering particles using the formula: absorption rate=1−transmittance−reflectivity; and then subtracting the light absorption rate of the substrate from the light absorption rate of the substrate and the light-scattering particles.

The thickness of the matrix may be maintained to be equal to or smaller than a predetermined value so as to have a low absorption rate, with the light absorption rate being 1% or less for the 380 nm to 420 nm range, the 420 nm to 450 nm range, and the 450 nm to 490 nm range. Here, the light absorption rate of the matrix layer may be obtained by coating the substrate with the matrix; measuring transmittance and reflectivity according to the wavelength using the Lambda950 spectrophotometer available from Perkin-Elmer, Inc.; calculating an absorption rate according to the wavelength using the formula: absorption rate=1−transmittance−reflectivity; and then subtracting the light absorption rate of the substrate from the absorption rate according to the wavelength.

When the matrix is applied over the light-scattering particles, the light absorption rate of the light extraction layer 200 may be measured to be equal to or less than 40%, 15%, and 10%, and preferably, 30%, 10%, and 10%, for the 380 nm to 420 nm range, the 420 nm to 450 nm range, and the 450 nm to 490 nm range.

The light-scattering particles may be $BaTiO_3$.

The matrix may be formed from a siloxane-based organic-inorganic hybrid material (including siloxane derivatives) having a low absorption rate. In some embodiments, the siloxane-based organic-inorganic hybrid material may be produced by causing a reaction by inputting a solution containing surface-modified $TiO_2$ into a silicone resin and removing a solvent and bubbles from a reaction solution during the reaction.

In order to adjust the light absorption rate of the light extraction layer 200, the ratio between the light-scattering particles 201 and the matrix may be adjusted, and a haze value may be 60% or more. The haze value may be measured by mounting a coated substrate to an open area of a measuring instrument (Haze-gard available from BYK Gardner GmbH).

In order to maintain a low light absorption rate, in some embodiments, a light extraction layer may be formed by mixing light-scattering particles with a carrier, applying and heating a resultant mixture, and applying a matrix over the resultant mixture.

In some other embodiments, the light extraction layer may be formed by applying a mixture of light-scattering particles, a carrier, and a matrix.

The carrier to be used may be diacetone alcohol, dipropylene glycol monomethyl ether, propylene glycol methyl ether acetate, or the like. The ratio of the carrier may be adjusted to range from 23 wt % to 63 wt % of the entire mixture.

When the mixture is applied by inkjet printing, the carrier, such as diacetone alcohol, dipropylene glycol monomethyl ether, or propylene glycol methyl ether acetate, may contribute in improving the quality of printing. However, in some cases, the added carrier may cause the bonding of links of Hybrimer (i.e. a sol-gel derived siloxane hybrid material) to be incomplete, thereby increasing the absorption rate, which is problematic. Thus, heating at a temperature equal to or higher than the boiling temperature of the added carrier is required.

The light absorption rates of $TiO_2$ light-scattering particles, $BaTiO_3$ light-scattering particles, the matrix layer, and the light extraction layer (matrix layer+light-scattering particles) according to the wavelength are as shown in Table 1. The matrix layer is formed from a siloxane-based organic-inorganic hybrid material. The matrix layer may be formed from three types of matrix materials, i.e., Matrix_A, Matrix_B, and Matrix_C, according to a variety of functional groups.

Matrix_A, Matrix_B, and Matrix_C may be siloxane-based organic-inorganic hybrid materials cross-linked with $TiO_2$ filler in order to obtain high refractivity, and a naphthyl group, a benzyl group, and a tolyl group may be used as alkyl branches. Since the organic-inorganic hybrid matrices, to which the functional groups are applied, absorb different wavelengths of light according to the natural frequencies thereof, it is important to increase the possibility that light generated by the organic light-emitting layer may be extracted instead of being absorbed while passing through the matrix layer when light-scattering particles reflect the light rather than absorbing the light.

TABLE 1

| Color Wavelength | Absorption (%) | | |
|---|---|---|---|
| | Violet 380-420 | Indigo 420-450 | Blue 450-490 |
| $TiO_2$ | 41.8 | 9.9 | 8.4 |
| $BaTiO_3$ | 5.8 | 5.2 | 5.1 |
| Matrix_B | 0.5 | 0 | 0.6 |
| $TiO_2$ + Matrix_A | 46.5 | 13.3 | 10.2 |
| $TiO_2$ + Matrix_B | 27.4 | 7.7 | 6.1 |
| $BaTiO_3$ + Matrix_A | 34.9 | 10.8 | 8.3 |
| $BaTiO_3$ + Matrix_C | 8.2 | 6.8 | 6.3 |

Referring to Table 1, it may be appreciated that $BaTiO_3$ has a significantly lower absorption rate than $TiO_2$ in the short-wavelength range, while the absorption rate of Matrix_B is close to zero (0). The low absorption rate in the short-wavelength range is especially advantages in a device producing an intended color in which a blue OLED or a white OLED is used as a backlight and phosphor is added in the form of a filter, because a phenomenon of decreasing efficiency and lifetime of phosphorescence may be optimally complemented by this method.

Example 1

A mixture (ink 1) suitable for inkjet coating was produced by mixing rutile $TiO_2$ powder (average particle size ranging from 20 nm to 50 nm, 20 wt % to 30 wt %) with dipropylene glycol monomethyl ether (70 wt % to 80 wt %) and 2-acrylamido-2-methylpropane sulfonic acid (available from Lubrizol Corporation, less than 0.1 wt %). In addition, a siloxane-based organic-inorganic hybrid solution (ink 2, matrix A) having a naphthyl group as a functional group was prepared.

The light extraction layer may be formed by three different methods. According to the first method, a glass substrate was coated with ink 1, followed by a heat treatment at 400° C. in a furnace for bake-out. Afterwards, the glass substrate coated with ink 1 was coated with ink 2 in order to produce a planarized surface. After a heat treatment performed at 200° C. in an oven, an ITO transparent electrode layer may be formed on a resultant light extraction layer substrate. The light extraction efficiency of an organic light-emitting device fabricated as above was 2.21 times the light extraction efficiency of an organic light-emitting device not having the light extraction layer.

According to the second method, a light extraction layer may be produced by mixing ink 1 and ink 2 and coating a glass substrate or a plastic substrate with a resultant mixture.

According to the third method, a light extraction layer may be produced by mixing light-scattering particles, the above-mentioned carrier, and ink 2 and coating a glass substrate or a plastic substrate with a resultant mixture.

Example 2

A mixture (ink 1) suitable for inkjet coating was produced by mixing rutile $TiO_2$ powder (average particle size ranging from 20 nm to 50 nm, 20 wt % to 30 wt %) with dipropylene glycol monomethyl ether (70 wt % to 80 wt %) and 2-acrylamido-2-methylpropane sulfonic acid (less than 0.1 wt %). In addition, a siloxane-based organic-inorganic hybrid solution (ink 2, matrix B) having a benzyl group as a functional group was prepared.

Similarly, the light extraction layer may be formed by three different methods. According to the first method, a glass substrate was coated with ink 1, followed by a heat treatment at 400° C. in a furnace for bake-out. Afterwards, the glass substrate coated with ink 1 was coated with ink 2 in order to produce a planarized surface. After a suitable heat treatment performed in an oven, an ITO transparent electrode layer may be formed on a resultant light extraction layer substrate. The light extraction efficiency of an organic light-emitting device fabricated as above was 2.49 times the light extraction efficiency of the organic light-emitting device not having the light extraction layer.

Example 3

A mixture (ink 1) suitable for inkjet coating was produced by mixing $BaTiO_3$ powder (average particle size ranging from 400 nm to 500 nm, 5 wt % to 15 wt %) with dipropylene glycol monomethyl ether (85 wt % to 95 wt %) and a surfactant (less than 0.1 wt %). A $BaTiO_3$ layer having a wet film thickness of 2 μm was formed from the resultant mixture by coating, and only $BaTiO_3$ powder was left after heating. Increases in the thickness of the layer may increase the light absorption and the outgassing that may cause dark spots. Thus, it is recommended that the layer be formed at a low thickness. In addition, a siloxane-based organic-inorganic hybrid solution (ink 2, matrix A) having a naphthyl group as a functional group was prepared.

Similarly, the light extraction layer may be formed by three different methods. According to the first method, a glass substrate was coated with ink 1, followed by a heat treatment at 400° C. in a furnace for bake-out. Afterwards, the glass substrate coated with ink 1 was coated with ink 2 in order to produce a planarized surface. After a heat treatment performed at 200° C. in an oven, an ITO transparent electrode layer may be formed on a resultant light extraction layer substrate. The light extraction efficiency of an organic light-emitting device fabricated as above was 2.61 times the light extraction efficiency of the organic light-emitting device not having the light extraction layer.

TABLE 2

| Item | Scattering material | Matrix | Efficacy (lm/W) | Extraction efficiency |
|---|---|---|---|---|
| Control OLED | None | None | 24.3 | — |
| Functional layer adopted OLED | $TiO_2$ | A | 53.8 | 2.21x |
| | $TiO_2$ | B | 60.5 | 2.49x |
| | $BaTiO_3$ | A | 63.2 | 2.61x |

When the organic light-emitting device not having the light extraction layer was taken as a control OLED, results illustrated in Table 2 were obtained. The results show that the extraction efficiency may vary depending on the combination of the light-scattering particles and the matrix and the maximum light extraction efficiency was 2.61 times.

Examples 1 to 3 above show that there is an optimum combination of the light-scattering particles and the matrix.

While the foregoing embodiments of the present disclosure have been described, the present disclosure is not limited thereto and may have a variety of other embodiments. The scope of the present disclosure shall be defined by the appended Claims and equivalents thereof. While the appended Claims are rendered so as to avoid the multiple dependent claim format as much as possible, features described in respective dependent claims may be implemented in combinations with not only features described in claims to which the dependent claims refer to but also features described in claims to which none of the dependent claims refer to, unless the context clearly indicates otherwise. Combinations of such features shall be included in the scope of the present disclosure.

Aspect (1) pertains to a light extraction substrate disposed on a front portion of an organic light-emitting diode to extract light from the organic light-emitting diode, the light extraction substrate comprising: a base substrate; and a light extraction layer disposed on the base substrate, wherein the light extraction layer comprises a matrix layer and $BaTiO_3$ light-scattering particles dispersed in the matrix layer.

Aspect (2) pertains to the light extraction substrate of Aspect (1), wherein the matrix layer comprises a siloxane-based organic-inorganic hybrid material.

Aspect (3) pertains to the light extraction substrate of Aspect (1) or Aspect (2), wherein the $BaTiO_3$ light-scattering particles have a light absorption rate of 10% or lower for any one or more of light with a wavelength ranging from 380 nm to 420 nm, light with a wavelength ranging from 420 nm to 450 nm, and light with a wavelength ranging from 450 nm to 490 nm.

Aspect (4) pertains to the light extraction substrate of Aspect (3), wherein the $BaTiO_3$ light-scattering particles have a light absorption rate of 7% or lower for any one or more of light with a wavelength ranging from 380 nm to 420 nm, light with a wavelength ranging from 420 nm to 450 nm, and light with a wavelength ranging from 450 nm to 490 nm.

Aspect (5) pertains to the light extraction substrate of any one of Aspects (1) through (4), wherein the $BaTiO_3$ light-scattering particles have an average particle size ranging from 90 nm to 1 µm.

Aspect (6) pertains to the light extraction substrate of any one of Aspects (1) through (5), wherein the thickness of the matrix layer is at least two times the average particle size of the $BaTiO_3$ light-scattering particles.

Aspect (7) pertains to the light extraction substrate of any one of Aspects (1) through (6), wherein the matrix layer has a light absorption rate of 1% or lower for any one or more of light with a wavelength ranging from 380 nm to 420 nm, light with a wavelength ranging from 420 nm to 450 nm, and light with a wavelength ranging from 450 nm to 490 nm.

Aspect (8) pertains to the light extraction substrate of any one of Aspects (1) through (7), wherein the light extraction layer has a light absorption rate of 40% or lower for light with a wavelength ranging from 380 nm to 420 nm, 15% or lower for light with a wavelength ranging from 420 nm to 450 nm, and 10% or lower for light with a wavelength ranging from 450 nm to 490 nm.

Aspect (9) pertains to the light extraction substrate of Aspect (8), wherein the light extraction layer has a light absorption rate of 30% or lower for light with a wavelength ranging from 380 nm to 420 nm, 10% or lower for light with a wavelength ranging from 420 nm to 450 nm, and 10% or lower for light with a wavelength ranging from 450 nm to 490 nm.

Aspect (10) pertains to the light extraction substrate of any one of Aspects (1) through (9), wherein the light extraction layer has a haze of 60% or higher.

Aspect (11) pertains to an organic light-emitting device comprising: the light extraction substrate as recited in one of Aspects (1) through (10); and an organic light-emitting diode disposed on the light extraction layer of the light extraction substrate.

What is claimed is:

1. A light extraction substrate disposed on a front portion of an organic light-emitting diode to extract light from the organic light-emitting diode, the light extraction substrate comprising:

a base substrate; and a light extraction layer disposed on the base substrate, wherein the light extraction layer comprises a matrix layer and $BaTiO_3$ light-scattering particles dispersed in the matrix layer, and wherein the $BaTiO_3$ light-scattering particles have an average particle size ranging from greater than 350 nm to less than 500 nm, and wherein the thickness of the matrix layer is two times the average particle size of the $BaTiO_3$ light-scattering particles.

2. The light extraction substrate of claim 1, wherein the matrix layer comprises a siloxane-based organic-inorganic hybrid material.

3. The light extraction substrate of claim 1, wherein the $BaTiO_3$ light-scattering particles have a light absorption rate of 10% or lower for any one or more of light with a wavelength ranging from 380 nm to 420 nm, light with a wavelength ranging from 420 nm to 450 nm, and light with a wavelength ranging from 450 nm to 490 nm.

4. The light extraction substrate of claim 3, wherein the $BaTiO_3$ light-scattering particles have a light absorption rate of 7% or lower for any one or more of light with a wavelength ranging from 380 nm to 420 nm, light with a wavelength ranging from 420 nm to 450 nm, and light with a wavelength ranging from 450 nm to 490 nm.

5. The light extraction substrate of claim 1, wherein the $BaTiO_3$ light-scattering particles have an average particle size from 400 nm to less than 500 nm.

6. The light extraction substrate of claim 1, wherein the matrix layer has a light absorption rate of 1% or lower for any one or more of light with a wavelength ranging from 380 nm to 420 nm, light with a wavelength ranging from 420 nm to 450 nm, and light with a wavelength ranging from 450 nm to 490 nm.

7. The light extraction substrate of claim 1, wherein the light extraction layer has a light absorption rate of 40% or lower for light with a wavelength ranging from 380 nm to 420 nm, 15% or lower for light with a wavelength ranging from 420 nm to 450 nm, and 10% or lower for light with a wavelength ranging from 450 nm to 490 nm.

8. The light extraction substrate of claim 7, wherein the light extraction layer has a light absorption rate of 30% or lower for light with a wavelength ranging from 380 nm to 420 nm, 10% or lower for light with a wavelength ranging from 420 nm to 450 nm, and 10% or lower for light with a wavelength ranging from 450 nm to 490 nm.

9. The light extraction substrate of claim 1, wherein the light extraction layer has a haze of 60% or higher.

10. An organic light-emitting device comprising:

the light extraction substrate as recited in any one of claims 1-4 or 5-9; and an organic light-emitting diode disposed on the light extraction layer of the light extraction substrate.

* * * * *